(12) United States Patent
Suzuki et al.

(10) Patent No.: US 10,312,166 B2
(45) Date of Patent: Jun. 4, 2019

(54) INSPECTION SYSTEM AND INSPECTION METHOD

(71) Applicant: HAMAMATSU PHOTONICS K.K., Hamamatsu-shi, Shizuoka (JP)

(72) Inventors: Shinsuke Suzuki, Hamamatsu (JP); Hirotoshi Terada, Hamamatsu (JP); Shunsuke Matsuda, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 99 days.

(21) Appl. No.: 15/547,858

(22) PCT Filed: Jan. 8, 2016

(86) PCT No.: PCT/JP2016/050517
§ 371 (c)(1),
(2) Date: Aug. 1, 2017

(87) PCT Pub. No.: WO2016/129305
PCT Pub. Date: Aug. 18, 2016

(65) Prior Publication Data
US 2018/0033704 A1 Feb. 1, 2018

(30) Foreign Application Priority Data

Feb. 10, 2015 (JP) ................................. 2015-024409

(51) Int. Cl.
*H01L 23/544* (2006.01)
*H01L 21/66* (2006.01)
(Continued)

(52) U.S. Cl.
CPC .......... *H01L 22/26* (2013.01); *B23K 26/0006* (2013.01); *B23K 26/032* (2013.01);
(Continued)

(58) Field of Classification Search
None
See application file for complete search history.

(56) References Cited

U.S. PATENT DOCUMENTS

2003/0102292 A1 6/2003 Han et al.
2018/0033704 A1* 2/2018 Suzuki ................ B23K 26/702

FOREIGN PATENT DOCUMENTS

JP 2000-091170 A 3/2000
JP 2001-085285 A 3/2001
(Continued)

OTHER PUBLICATIONS

International Preliminary Report on Patentability dated Aug. 24, 2017 for PCT/JP2016/050517.

*Primary Examiner* — Jack S Chen
(74) *Attorney, Agent, or Firm* — Drinker Biddle & Reath LLP

(57) ABSTRACT

An inspection system includes a laser light source, an optical system for laser marking that irradiates a semiconductor device with laser light from a metal layer side, a control unit that controls the laser light source to control laser marking, a two-dimensional camera that detects light from the semiconductor device on a substrate side and outputs an optical reflection image, and an analysis unit that generates a pattern image of the semiconductor device, and the control unit controls the laser light source so that laser marking is performed until a mark image appears in a pattern image.

13 Claims, 9 Drawing Sheets

(51) Int. Cl.
  *B23K 26/70* (2014.01)
  *B23K 26/362* (2014.01)
  *G06T 7/00* (2017.01)
  *H01L 21/67* (2006.01)
  *B23K 26/00* (2014.01)
  *B23K 26/03* (2006.01)
  *B23K 26/402* (2014.01)
  *B23K 26/359* (2014.01)
  *B23K 26/364* (2014.01)
  *B23K 26/352* (2014.01)
  *G02B 5/20* (2006.01)
  *B23K 101/42* (2006.01)
  *B23K 103/10* (2006.01)
  *B23K 103/16* (2006.01)

(52) U.S. Cl.
  CPC .......... *B23K 26/355* (2018.08); *B23K 26/359* (2015.10); *B23K 26/362* (2013.01); *B23K 26/364* (2015.10); *B23K 26/402* (2013.01); *B23K 26/702* (2015.10); *G06T 7/0008* (2013.01); *H01L 21/67282* (2013.01); *H01L 23/544* (2013.01); *B23K 2101/42* (2018.08); *B23K 2103/10* (2018.08); *B23K 2103/166* (2018.08); *G02B 5/208* (2013.01); *G06T 2207/10048* (2013.01); *G06T 2207/10152* (2013.01); *G06T 2207/30148* (2013.01); *G06T 2207/30204* (2013.01); *H01L 2223/54426* (2013.01)

(56) References Cited

FOREIGN PATENT DOCUMENTS

| | | |
|---|---|---|
| JP | 2002-340990 A | 11/2002 |
| JP | 201213848 A | 4/2012 |
| TW | 201213849 A | 4/2012 |

\* cited by examiner

INSPECTION SYSTEM AND INSPECTION METHOD

TECHNICAL FIELD

An aspect of the present invention relates to an inspection system for a semiconductor device and an inspection method therefor.

BACKGROUND ART

A technology for testing a semiconductor device includes a technology for performing marking by irradiating several places around a fault point with laser light when the fault point is identified. Such a technology is a very effective technology since a fault point can be easily recognized by marking in a post-process of fault analysis.

For example, Patent Literature 1 discloses a technology for detecting a fault point using Optical Beam Induced Current (OBIC) measurement with respect to a semiconductor device formed from a substrate and a metal layer on the substrate and performing laser marking around the fault point. More specifically, Patent Literature 1 discloses a technology for performing laser light irradiation from the substrate side to perform the OBIC measurement, and then, performing laser marking around the fault point using a laser marking optical system arranged on the metal layer side of the semiconductor device. In Patent Literature 1, laser marking is performed from the metal layer side in order to prevent the semiconductor device from being damaged when laser marking is performed from the substrate side.

CITATION LIST

Patent Literature

[Patent Literature 1] Japanese Unexamined Patent Application Publication No. 2002-340990

SUMMARY OF INVENTION

Technical Problem

Here, in Patent Literature 1, optical axes of laser beams of the measurement optical system on the substrate side and the laser marking optical system on the metal layer side are matched in advance, but marking may not be performed at a desired position with respect to a position of a fault point due to movement accuracy, vibration, or the like of a stage that moves the laser marking optical system. In a post-process of fault analysis, since the position of the fault point is recognized based on a marking position and processing such as cutting of the semiconductor device is performed, a great problem is that the marking is not performed at a desired position with respect to the position of the fault point.

Therefore, an object of an aspect of the present invention is to provide an inspection system and an inspection method capable of allowing a marking position to be accurately recognized with respect to a position of a fault point by enabling a marking position to be observed from a substrate side even when laser marking is performed from a metal layer side of a semiconductor device.

Solution to Problem

An inspection system according to an aspect of the present invention is an inspection system that performs laser marking on a semiconductor device in which a metal layer is formed on a substrate, the inspection system including: a first light source that outputs laser light; an optical system for laser marking that irradiates the semiconductor device with laser light output by the first light source from the metal layer side; a marking control unit that controls the laser marking; an observation optical system that is arranged on the substrate side of the semiconductor device and transmits light from the semiconductor device; a photodetector that detects the light from the semiconductor device through the observation optical system and outputs a detection signal; and an image processing unit that generates a pattern image of the semiconductor device based on the detection signal. The marking control unit controls the irradiation of the laser light so that the laser marking is performed until a mark image formed by the laser marking appears in the pattern image.

Further, an inspection method according to an aspect of the present invention is an inspection method of performing laser marking on a semiconductor device in which a metal layer is formed on a substrate, the inspection method including: a step of irradiating the semiconductor device with laser light from the metal layer side and performing laser marking; a step of transmitting light from the semiconductor device to a photodetector by using an observation optical system arranged on the substrate side of the semiconductor device; and a step of generating a pattern image of the semiconductor device based on a detection signal output from the photodetector according to the light from the semiconductor device. The step of performing the laser marking includes performing the irradiation of the laser light until a mark image formed by the laser marking appears in the pattern image.

In the inspection system and the inspection method, the semiconductor device is irradiated with the laser light from the metal layer side of the semiconductor device. Further, light from the semiconductor device is detected using the observation optical system arranged on the substrate side of the semiconductor device, and the pattern image of the semiconductor device is generated from the detection signal according to the detection. Laser marking is performed until the mark image formed by laser marking appears in the pattern image. Thus, since laser marking is performed until the mark image appears on the pattern image according to the light from the semiconductor device detected on the substrate side, it is possible to confirm the marking position from the substrate side. Further, since laser marking is performed until the mark image appears in the pattern image, it is possible to allow accurate recognition of the marking position with respect to the position of the fault point by confirming the pattern image.

In the inspection system according to the aspect of the present invention, the marking control unit may control the irradiation of the laser light so that laser marking is performed until the laser light penetrates through the metal layer. Further, in the inspection method according to the aspect of the present invention, the step of performing the laser marking may include performing the laser marking until the laser light penetrates the metal layer. Accordingly, for example, it is possible to reliably confirm the marking position even when the metal layer is cut out and the fault point is analyzed, for example, after a post-process in fault analysis, that is, laser marking.

In the inspection system according to the aspect of the present invention, the image processing unit may generate a pattern image while the laser marking is being performed by the laser light. Further, in the inspection method according to an aspect of the present invention, the step of generating the pattern image may include generating the pattern image while the laser marking is being performed. Accordingly, it is possible to confirm formation of a mark image while performing laser marking, and to perform the laser marking until the marking position can be recognized using the pattern image.

Further, the inspection system according to an aspect of the present invention may further include a second light source that outputs illumination light, and the photodetector may be a two-dimensional camera that images the illumination light reflected in the semiconductor device through the observation optical system. Accordingly, it is possible to acquire the pattern image of the semiconductor device using an optical system or a photodetector for detecting luminescence from the semiconductor device or the like. Thus, it is possible to allow accurate recognition of the marking position with respect to the position of the fault point in the pattern image.

Further, in the inspection system according to an aspect of the present invention, the photodetector may be an infrared camera that images heat rays from the semiconductor device. By including the infrared camera, it is possible to acquire the pattern image of the semiconductor device using the photodetector for detecting heat rays from a semiconductor device, such as generated heat measurement. Thus, it is possible to allow accurate recognition of the marking position with respect to the position of the fault point in the pattern image.

Further, the inspection system according to an aspect of the present invention may further include a second light source that outputs light. The observation optical system may include an optical scanning unit, scan the semiconductor device with the light output from the second light source from the substrate side, and transmit light reflected from the semiconductor device according to the scanned light to the photodetector. Accordingly, it is possible to acquire the pattern image of the semiconductor device using an observation optical system or a photodetector for irradiating the semiconductor device with light, such as OBIC measurements and electro optical probing (EOP) measurement. Thus, it is possible to allow accurate recognition of the marking position with respect to the position of the fault point in the pattern image.

Further, in the inspection system and the inspection method according to the aspect of the present invention, a wavelength of the laser light may be equal to or longer than 1000 nm, and the observation optical system may include an optical filter that blocks light including these wavelengths of the laser light. Accordingly, even when the laser light output from the first light source is transmitted through the substrate of the semiconductor device, the laser light is blocked in the observation optical system. Thus, it is possible to prevent the photodetector from being damaged by the laser light.

Further, in the inspection system and the inspection method according to the aspect of the present invention, a wavelength of the laser light may be shorter than 1000 nanometers. Accordingly, for example, when the semiconductor device includes a substrate such as a silicon substrate, the laser light is absorbed into the substrate. Thus, it is possible to prevent the photodetector from being damaged by the laser light.

Advantageous Effects of Invention

According to the inspection system and the inspection method, it is possible to accurately recognize a marking position with respect to a position of a fault point by enabling a marking position to be observed from a substrate side even when laser marking is performed from a metal layer side of a semiconductor device.

BRIEF DESCRIPTION OF DRAWINGS

FIG. 2(a) is a back view of the laser marked semiconductor device, FIG. 2(b) is a front view of the laser marked semiconductor device, and FIG. 2(c) is a cross-sectional view taken along line II(c)-II(c) of FIG. 2(b).

DESCRIPTION OF EMBODIMENTS

Figure 1:
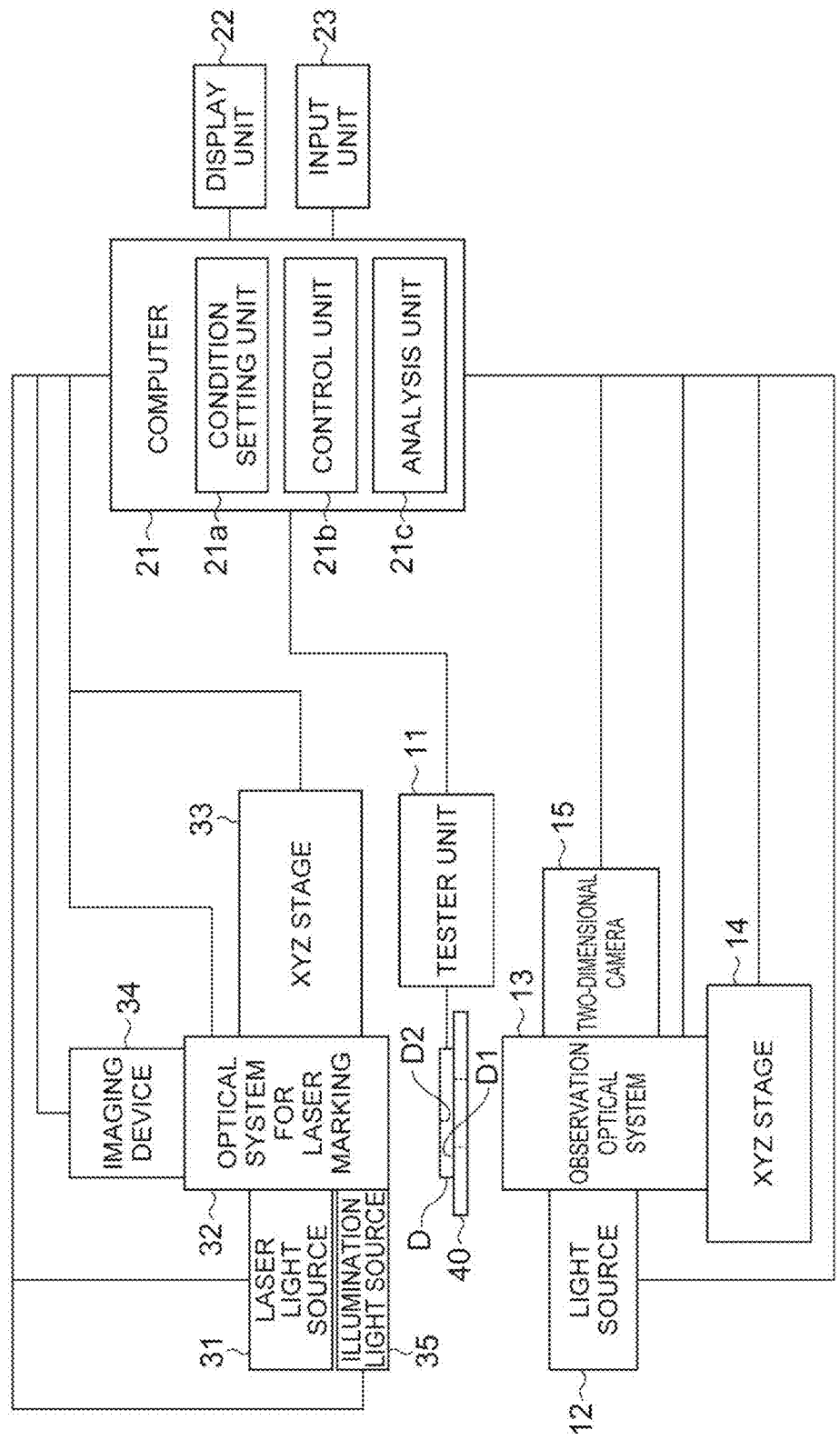
FIG. 1 is a configuration diagram of an inspection system according to a first embodiment of the present invention.

Hereinafter, embodiments of the present invention will be described in detail with reference to the drawings. In each figure, the same or corresponding parts are denoted with the same reference numerals, and repeated descriptions are omitted.

First Embodiment

As illustrated in FIG. 1, an inspection system 1 according to this embodiment is an apparatus for testing a semiconductor device D that is a device under test (DUT), such as identifying of a fault point in the semiconductor device D. More specifically, the inspection system 1 identifies the fault point and performs marking to indicate the fault point around the fault point. With this marking, it is possible to easily recognize the fault point identified by the inspection system 1 in a post-process of fault analysis.

The semiconductor device D includes an integrated circuit having a PN junction of a transistor or the like (for example, small scale integration (SSI), medium scale integration (MSI), large scale integration (LSI), very large scale integration (VLSI), ultra large scale integration (VLSI), or Giga scale integration (GSI)), a MOS transistor for high current/high voltage, a bipolar transistor, and a power semiconductor device (power device), or the like. The semiconductor device D has a configuration in which a metal layer is formed on a substrate. As the substrate of the semiconductor device D, for example, a silicon substrate is used. The semiconductor device D is placed on a sample stage 40.

The inspection system 1 performs a fault point identification process of identifying a fault point of the semiconductor device D, and a marking process of performing marking to indicate the fault point around the identified fault point. First, a functional configuration of the inspection system 1 related to the fault point identification process will be described.

The inspection system 1 includes a tester unit 11, a light source 12 (a second light source), an observation optical system 13, an XYZ stage 14, a two-dimensional camera 15 (a photodetector), a computer 21, a display unit 22, and an input unit 23 as components related to the fault point identification process.

The tester unit 11 functions as a stimulus signal applying unit that is electrically connected to the semiconductor device D through a cable and applies a stimulus signal to the semiconductor device D. The tester unit 11 is operated by a power supply (not illustrated), and repeatedly applies a stimulus signal such as a predetermined test pattern to the semiconductor device D. The tester unit 11 may apply a modulated current signal or may apply a continuous wave (CW) current signal. The tester unit 11 is electrically connected to the computer 21 through a cable and applies a stimulus signal such as a test pattern designated by the computer 21 to the semiconductor device D. The tester unit 11 may not necessarily be electrically connected to the computer 21. When the tester unit 11 is not electrically connected to the computer 21, the tester unit 11 determines a stimulus signal such as a test pattern alone and applies the stimulus signal such as a test pattern to the semiconductor device D.

The light source 12 is operated by a power supply (not illustrated) and outputs light for illuminating the semiconductor device D. The light source 12 is a light emitting diode (LED), a lamp light source, or the like. A wavelength of the light output from the light source 12 is a wavelength that is transmitted through a substrate of the semiconductor device D. The wavelength is, for example, 1064 nm or more when the substrate of the semiconductor device D is silicon. The light output from the light source 12 is guided to the observation optical system 13.

The observation optical system 13 irradiates the semiconductor device D with the light output from the light source 12 from the substrate side of the semiconductor device D, that is, a back surface D1 side of the semiconductor device D. The observation optical system 13 includes a beam splitter and an objective lens. The objective lens concentrates the light output from the light source 12 and guided by the beam splitter, on an observation area. The observation optical system 13 is placed on the XYZ stage 14. When the optical axis direction of the objective lens is a Z-axis direction, the XYZ stage 14 is movable in the Z-axis direction, and an X-axis direction and a Y-axis direction orthogonal to the Z-axis direction. The XYZ stage 14 is movable in the above-described three axis directions under control of a control unit 21b (described below) of the computer 21. The observation area is determined by a position of the XYZ stage 14.

The observation optical system 13 transmits light (reflected light) reflected in the semiconductor device D to the two-dimensional camera 15 according to light transmitted through the substrate of the semiconductor device D and used for illumination. Specifically, light radiated from the observation optical system 13 is transmitted through a substrate SiE (see FIGS. 2(a) to 2(c)) of the semiconductor device D and is reflected by a metal layer ME (see FIGS. 2(a) to 2(c)). The light reflected by the metal layer ME is transmitted through the substrate SiE again and input to the two-dimensional camera 15 through the objective lens and the beam splitter of the observation optical system 13. Further, the observation optical system 13 transmits emitted light generated in the semiconductor device D due to the application of the stimulus signal, to the two-dimensional camera 15. Specifically, emitted light (for example, emission light) mainly generated in the metal layer ME of the semiconductor device D due to the application of the stimulus signal is transmitted through the substrate SiE and input to the two-dimensional camera 15 through the objective lens and the beam splitter of the observation optical system 13.

The two-dimensional camera 15 images the light from the semiconductor device D and outputs image data (detection signal). For example, the two-dimensional camera 15 images the light reflected from the semiconductor device D and outputs image data for creating a pattern image. A marking position can be recognized based on the pattern image. Further, the two-dimensional camera 15 images the luminescence from the semiconductor device D and outputs image data for generating an luminescence image. A luminescence point in the semiconductor device D can be identified based on the luminescence image. By identifying the luminescence point, the fault point of the semiconductor device D can be identified. As the two-dimensional camera 15 that measures the luminescence, a camera on which a charge coupled device (CCD) image sensor or a complementary metal oxide semiconductor (CMOS) image sensor that can detect light with a wavelength transmitted through the substrate SiE of the semiconductor device D is mounted, an InGaAs camera, a mercury cadmium telluride (MCT) camera, or the like may be used. Since the light for illumination of the light source 12 is unnecessary in luminescence measurement, it is not necessary to operate the light source 12.

The computer 21 is electrically connected to the two-dimensional camera 15 through a cable. The computer 21 is a computer such as a personal computer. The computer 21 includes a central processing unit (CPU) that is a processor, and a random access memory (RAM) or a read only memory (ROM) that is a recording medium. The computer 21 performs generation of an image or input and output of information to be described below using the CPU. The computer 21 creates the pattern image or the luminescence image based on the image data input from the two-dimensional camera 15. Here, it is difficult to identify the luminescence position in the pattern of the semiconductor device D only with the luminescence image described above. Therefore, the computer 21 generates, as an analysis image, a superimposed image in which the pattern image based on the reflected light from the semiconductor device D and the luminescence image based on the luminescence from the semiconductor device D are superimposed.

The computer 21 outputs the created analysis image to the display unit 22. The display unit 22 is a display device such as a display for showing the analysis image or the like to a user. The display unit 22 displays the input analysis image. In this case, the user confirms a position of the fault point from the analysis image displayed on the display unit 22, and inputs information indicating the fault point to the input unit 23. The input unit 23 is an input device such as a keyboard or a mouse that receives an input from the user. The input unit 23 outputs the information indicating the fault point, which is received from the user, to the computer 21. The computer 21, the display unit 22, and the input unit 23 may be a tablet terminal. This is a description of a functional configuration of the inspection system 1 related to the fault point identification process.

Next, the functional configuration of the inspection system 1 related to the marking process of performing marking to indicate the fault point around the identified fault point will be described.

The inspection system 1 further includes a laser light source 31 (a first light source), a laser marking optical system 32, an XYZ stage 33, an imaging device 34, and an illumination light source 35, in addition to the functional configuration related to the above-described fault identification process as a functional configuration related to the marking process. Further, the computer 21 includes a condition setting unit 21a, a control unit 21b (marking control unit), and an analysis unit 21c (image processing unit).

Figure 2:
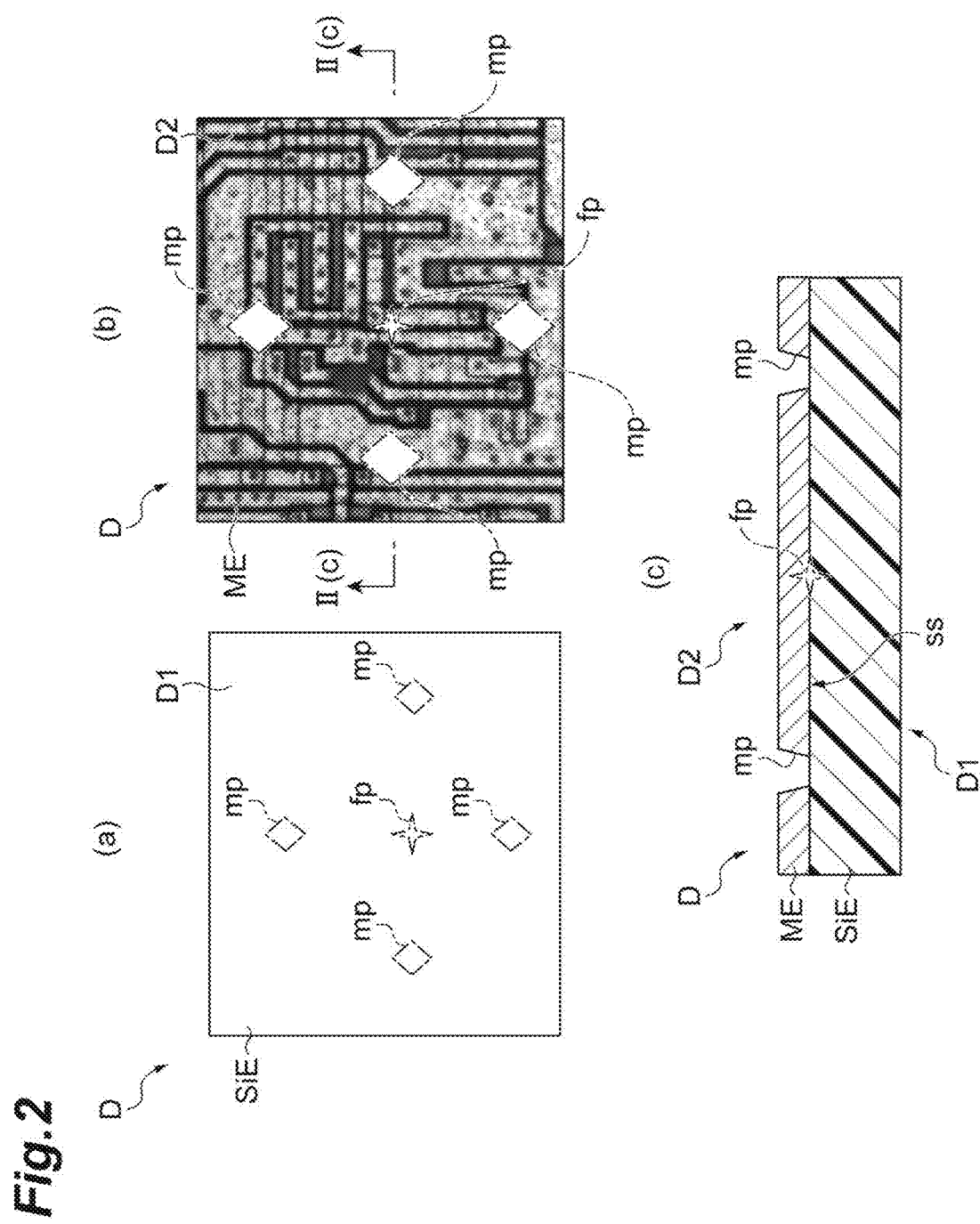
FIGS. 2(a) to 2(c) are views illustrating a laser marking image on a semiconductor device.

In the marking process, laser marking is performed around the fault point identified in the fault point identification process. As illustrated in FIGS. 2A and 2B, a marking point mp is set, for example, at four points around the fault point fp. In a state in which the laser marking is completed, laser marking has been performed to penetrate the metal layer ME of the semiconductor device D, as illustrated in FIG. 2(c). The laser marking is performed to the extent that a hole formed by the laser marking reaches a boundary surface ss between the metal layer ME and the substrate SiE and a surface of the substrate SiE in contact with the metal layer ME is exposed.

Figure 3:
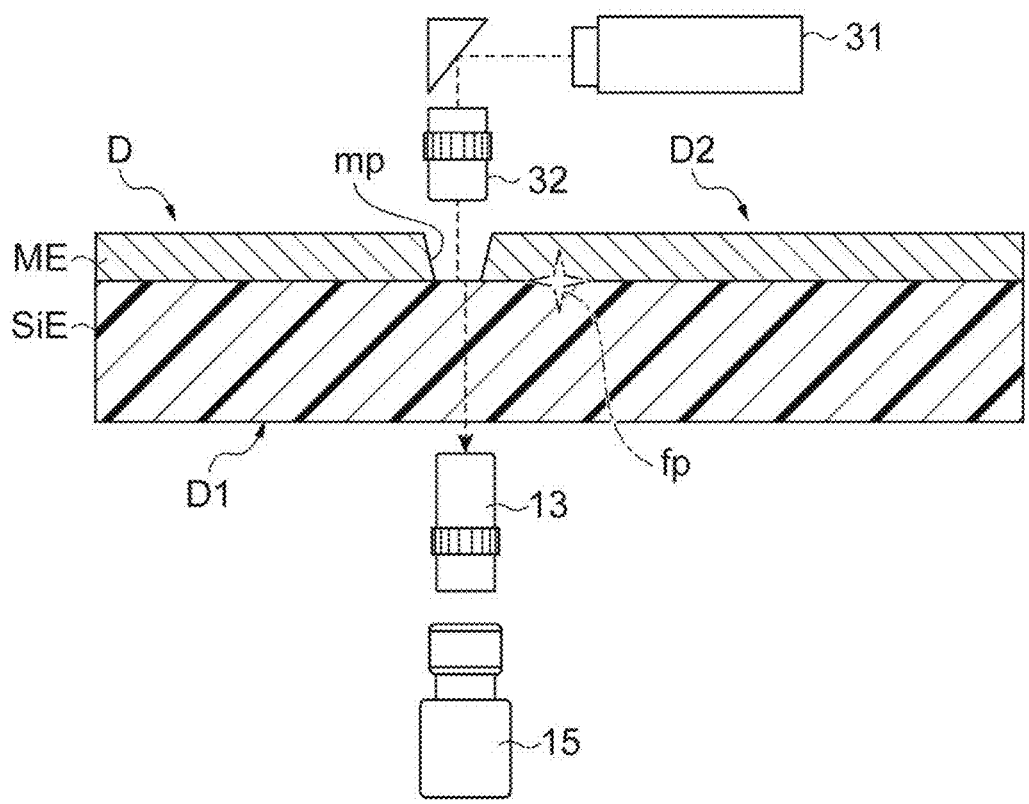
FIG. 3 is a diagram illustrating marking control in the inspection system of FIG. 1.

In the marking process, the marking points mp of the semiconductor device D are irradiated with the laser light output by the laser light source 31 through the laser marking optical system 32, as illustrated in FIG. 3. That is, the marking points mp are irradiated with the laser light from the metal layer ME side of the semiconductor device D. On the substrate SiE side of the semiconductor device D, the semiconductor device D is irradiated with the light generated by the light source 12, and the reflected light from the semiconductor device D is detected by the two-dimensional camera 15 through the observation optical system 13. Thus, in the marking process, the detection of the reflected light of the semiconductor device D is performed on the substrate SiE side while performing the irradiation of the marking points mp with the laser light on the metal layer ME side. Hereinafter, the functional configuration of the inspection system 1 related to the marking process will be described in detail.

Referring back to FIG. 1, the condition setting unit 21a of the computer 21 sets the marking points mp based on the information indicating the fault point fp input from the input unit 23. The marking points mp are set at several places around the identified fault point fp. For example, the several places are four points. For example, when the information indicating the fault point fp is input, the condition setting unit 21a automatically sets the marking points mp at four points around the fault point fp centered on the fault point fp. Specifically, for example, in a plan view, the marking points mp may be set in a cross shape centered on the fault point fp (see FIGS. 2A and 2B). The marking point nip may be set by the input unit 23 receiving an input of the information indicating the marking point mp from the user who has seen the analysis image displayed on the display unit 22. In this case, the condition setting unit 21a sets the marking point mp based on the information indicating the marking point mp input from the input unit 23 without automatically setting the marking point mp. The condition setting unit 21a generates a reference image obtained by adding marks indicating the fault point fp and the marking point mp to the analysis image, and stores the reference image in the computer 21.

Coordinate systems of the XYZ stages 14 and 33 are set such that the reference positions coincide. The control unit 21b of the computer 21 moves the XYZ stages 14 and 33 in three axial directions by controlling the XYZ stages 14 and 33. Specifically, the control unit 21b moves the XYZ stage 33 on which the laser marking optical system 32 is placed so that laser marking is performed at the marking point mp set by the condition setting unit 21a. When there are a plurality of marking points nip, the control unit 21b performs control so that laser marking is sequentially performed at all the marking points mp. That is, when laser marking at one marking point mp is completed, the control unit 21b moves the XYZ stage 33 so that laser marking of the next marking point mp is performed. When the movement of the XYZ stage 33 is completed, the control unit 21b outputs an output start signal to the laser light source 31. After the marking point mp is set by the condition setting unit 21a, the control unit 21b may not move the XYZ stage 14.

The laser light source 31 is operated by a power supply (not illustrated) and outputs laser light to be radiated to the semiconductor device D. When the output start signal is input by the control unit 21b, the laser light source 31 starts output of the laser light. As the laser light source 31, a solid-state laser light source, a semiconductor laser light source, or the like can be used. A wavelength of the light output from the laser light source 31 is 250 nanometers to 2000 nanometers.

The laser marking optical system 32 irradiates the marking point mp of the semiconductor device D with the laser light output from the laser light source 31 from the metal layer ME side of the semiconductor device D, that is, a surface D2 side of the semiconductor device D. The laser marking optical system 32 includes a switching unit and an objective lens. The switching unit switches between optical paths of the laser light source 31 and the imaging device 34 (described below). The objective lens concentrates the laser light from the laser light source 31 on the marking point mp. Further, the objective lens guides the light from the surface of the semiconductor device D to the imaging device 34. The laser marking optical system 32 is placed on the XYZ stage 33. When an optical axis direction of the objective lens is a Z-axis direction, the XYZ stage 33 is movable in the Z-axis direction and an X axis direction and a Y-axis direction orthogonal to the Z-axis direction. The XYZ stage 33 is movable in the above-described three axis directions under control of the control unit 21b. The laser marking optical system 32 rather than the XYZ stage 33 may include an optical scanning unit (for example, an optical scanning element such as a galvano mirror or an MEMS mirror), so that light is concentrated on the marking point mp on the surface D2 of the semiconductor device D. Further, the laser marking optical system 32 may include a shutter to allow passage of or block the laser light from the laser light source 31 under control of the control unit 21b, thereby controlling the output of the laser light.

The imaging device 34 images the metal layer ME of the semiconductor device D from the surface D2 side of the semiconductor device D. The captured image captured by the imaging device 34 is output to the computer 21 and displayed on the display unit 22. By confirming the captured image, the user can recognize a laser marking situation as seen from the surface D2 side of the semiconductor device D. The semiconductor device D is illuminated using the illumination light source 35 when imaging is performed by the imaging device 34.

In the marking process, a state of the semiconductor device D can be recognized from the substrate SiE side, that is, a back surface D1 side of the semiconductor device D by the two-dimensional camera 15. That is, in the marking process, the light source 12 outputs light to be radiated to the back surface D1 side of the semiconductor device D. The observation optical system 13 irradiates the back surface D1 of the semiconductor device D with the light output from the light source 12. Since the XYZ stage 14 is fixed after the fault point is identified and the marking point is set by the condition setting unit 21a as described above, the position of the observation area on the back surface D1 of the semiconductor device D does not change. The observation optical system 13 transmits the reflected light from the semiconductor device D according to the irradiation light to the two-dimensional camera 15 as the light from the semiconductor device D. The two-dimensional camera 15 detects the reflected light transmitted through the observation optical system 13 to generate image data (detection signal). The two-dimensional camera 15 outputs the image data to the computer 21.

The analysis unit 21c of the computer 21 generates a pattern image based on the image data generated by the two-dimensional camera 15. The analysis unit 21c sequentially generates the pattern image in parallel with the laser marking using the laser light output by the laser light source 31. Here, a hole is formed in the metal layer ME at the marking point mp through the laser marking. When the hole is shallow, that is, when the hole formed by the laser marking does not reach the substrate SiE and is formed only in the metal layer ME, an intensity change of the reflected light at a marking position is small and a change in optical reflection image is small. Therefore, an influence of the laser marking does not appear in the pattern image. On the other hand, if the hole is deeper, specifically, if the hole is deeper to the extent that the hole reaches a boundary surface ss between the metal layer ME and the substrate SiE, at least one of a refractive index, transmittance, and reflectance of light on the back surface D1 side is greatly changed. Accordingly, an intensity change of the reflected light at the marking position is increased, and the mark image indicating the marking point appears in the pattern image.

The analysis unit 21c, for example, compares the above-described reference image with the pattern image and determines that the mark image has appeared when a difference between the images is greater than a predetermined defined value. By setting the defined value in advance, it is possible to determine a timing at which the mark image is determined to have appeared. A penetration threshold value with which the mark image is determined to have appeared when the laser marking is performed until the metal layer ME is penetrated is set as the defined value.

Further, the analysis unit 21c may determine whether or not the mark image has appeared according to input content from the user. In this case, the pattern image is displayed on the display unit 22. Information on whether or not the mark image has appeared in the pattern image is input to the input unit 23 by the user who has visually confirmed the pattern image. The input unit 23 outputs information on whether or not the mark image has appeared, to the computer 21. The analysis unit 21c determines whether or not the mark image has appeared based on the information on whether or not the mark image has appeared.

The analysis unit 21c compares the reference image with the pattern image when the mark image is determined to have appeared, and determines that a mark formation shift has occurred when a mark formation point of the pattern image is deviated from the marking point mp of the reference image. In this case, the control unit 21b may perform control so that position movement of the XYZ stages 14 and 33 is performed and a mark is formed at a correct marking point mp.

The control unit 21b controls the laser light source 31 to control the laser marking. If the mark image is determined to have appeared by the analysis unit 21c, the control unit 21b outputs an output stop signal to the laser light source 31. If the output stop signal is input, the laser light source 31 stops the output of the laser light. Therefore, the laser light source 31 outputs the laser light until the output stop signal is input after the input start signal is input by the control unit 21b. From the above, the control unit 21b controls the laser light source 31 so that the laser marking is performed until the mark image formed by laser marking appears in the pattern image. Further, since the above-described penetration threshold value is set, the control unit 21b controls the laser light source 31 so that laser marking is performed until the laser light passes through the metal layer ME.

The analysis unit 21c superimposes the luminescence image on the pattern image including the mark image to create the marking image. The created marking image is stored in the computer 21. Further, the analysis unit 21c displays the marking image on the display unit 22. From the marking image, the user can accurately recognize the marking position for the position of the fault point in a post-process. Further, the analysis unit 21c acquires marking information necessary to recognize the marking position for the position of the fault point, such as a distance between the marking position and the position of the fault point or a direction of the marking position from the position of the fault point. The acquired marking information may be displayed as a list or may be added to the marking image and displayed. Further, the information may be output on a paper medium.

Figure 4:
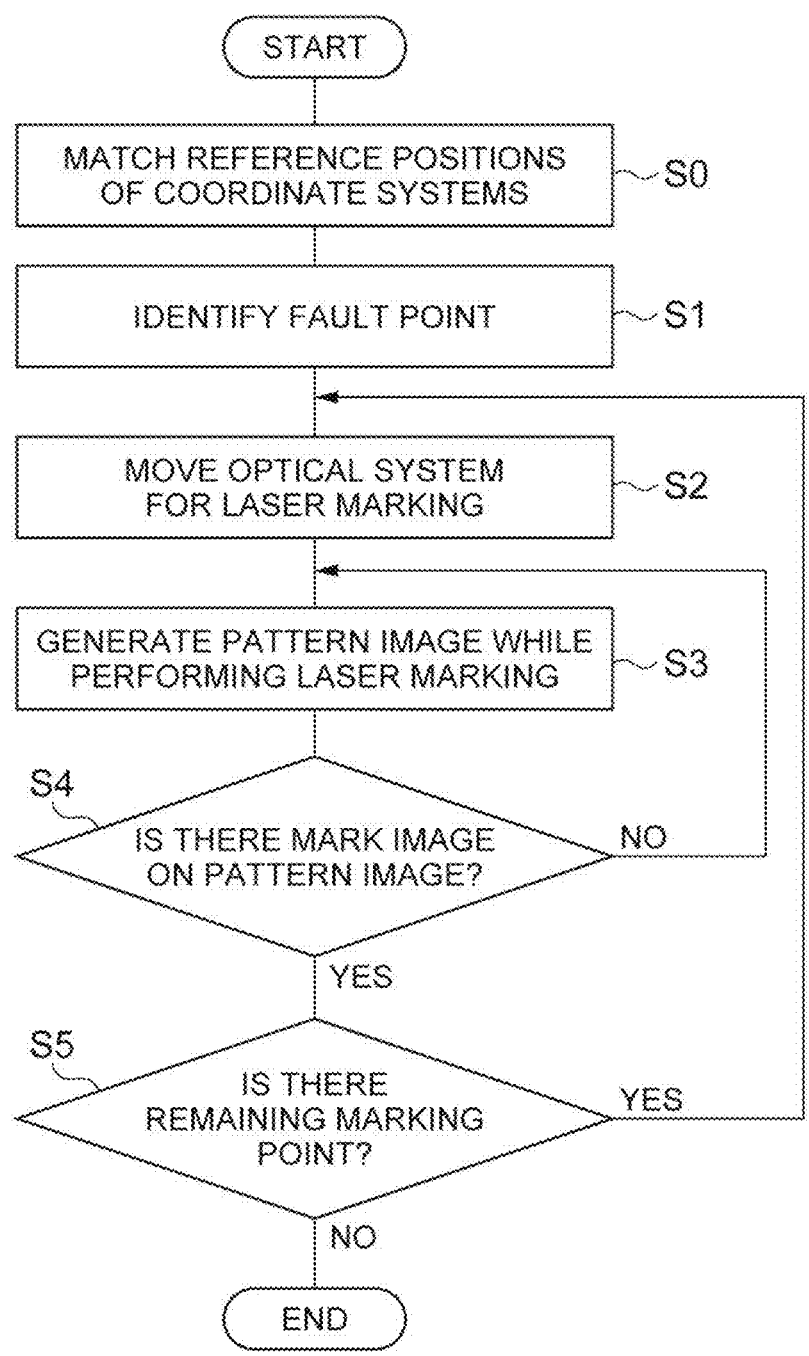
FIG. 4 is a flowchart of a marking process in the inspection system of FIG. 1.

Next, the marking process of the inspection system 1 will be described with reference to FIG. 4.

Figure 9:
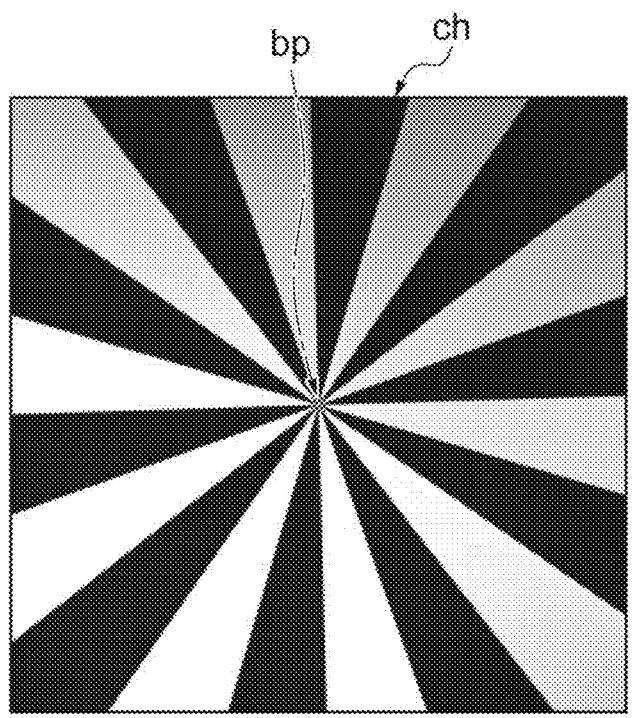
FIG. 9 is a diagram illustrating an image of a radially extending pattern.

The reference positions of the coordinate systems of the XYZ stages 14 and 33 are set to match as a prerequisite that the marking process is performed (step S0). Specifically, a chart Ct with marks is arranged on the sample stage 40 and is imaged by the imaging device 34 and the two-dimensional camera 15. Based on the acquired image, the coordinate systems of the XYZ stages 14 and 33 are set to match (be synchronized). In the chart Ct, a pattern extending radially around a reference point bp is provided on one surface of a glass plate or a silicon plate, as illustrated in FIG. 9. This pattern, for example, can be created by a thin film of aluminum. Since the glass plate or the silicon plate transmits light with a wavelength that is transmitted through the substrate SiE of the semiconductor device D, the light output from the illumination light source 35 or the light source 12 is also transmitted. Therefore, it is possible to acquire an image of the pattern provided on one surface of the glass plate or the silicon plate using the imaging device 34 and the two-dimensional camera 15. In the case of heat ray observation to be described below, since heat rays may be absorbed into a glass plate, a chart Ct is arranged on the sample stage 40 so that a surface on which the pattern is provided is on the observation optical system 13 side. The pattern may be provided on both sides of the plate.

Then, the fault point of the semiconductor device D is identified (step S1). Specifically, first, the XYZ stage 14 is controlled so that a visual field of the observation optical system 13 is located in an area to be observed. The XYZ stage 14 is controlled so that a focus of the objective lens is formed in the area to be observed. When the visual field of the observation optical system 13 is located in the area to be observed, the semiconductor device D is irradiated with the light output by the light source 12 from the back surface D1 side of the semiconductor device D by the observation optical system 13, and the optical reflection image generated by the two-dimensional camera 15 is acquired. Then, the stimulation signal is applied to the semiconductor device D using the tester unit 11, and the luminescence image is acquired by the two-dimensional camera 15. The acquired optical reflection image and the luminescence image are superimposed to create an analysis image, and the fault point fp is identified based on the analysis image.

Then, the marking point mp is set according to the position of the fault point fp, and the XYZ stage 33 is moved to a position according to the marking point mp by the control unit 21b of the computer 21. Accordingly, the optical system 32 for laser marking placed on the XYZ stage 33 is moved to an appropriate position according to the marking point mp (step S2).

Subsequently, the laser light is output by the laser light source 31, laser marking at the marking point mp is performed, and the pattern image is generated by the analysis unit 21c (step S3). Whether or not the mark image has appeared on the pattern image is determined by the analysis unit 21c (step S4).

When it is determined in S4 that the mark image has not appeared on the pattern image, the process of S3 is performed again. On the other hand, when it is determined in S4 that the mark image has appeared, it is determined whether or not there is a marking point mp at which laser marking has not been performed (step S5). When it is determined in S5 that there is a marking point mp at which laser marking has not been performed, the process of S2 is performed again. On the other hand, when it is determined in S5 that there are no marking points mp at which laser marking has not been performed, the marking process is completed.

Next, advantageous effects of the inspection system 1 will be described.

In the inspection system 1, the marking point nap of the metal layer ME, that is, the surface D2 of the semiconductor device D is irradiated with the laser light output from the laser light source 31. Further, on the substrate SiE side, that is, the back surface D1 side of the semiconductor device D, the reflected light from the semiconductor device D is detected by the two-dimensional camera 15, and an optical reflection image is generated. The pattern image is generated based on the optical reflection image by the analysis unit 21c.

The laser light source 31 is controlled by the control unit 21b so that laser marking is performed until the mark image is determined to have appeared in the pattern image by the analysis unit 21c. Thus, since laser marking is performed until the mark image appears in the pattern image according to the reflected light detected on the substrate SiE side of the semiconductor device D, the marking position can be confirmed from not only the metal layer ME side irradiated with the laser light, but also the substrate SiE side. Accordingly, in a post-process in fault analysis, it is possible to easily recognize a fault point from both of the metal layer ME and the substrate SiE.

Further, since laser marking is performed until the mark image appears in the pattern image, it is possible to allow accurate recognition of the marking position for the fault point by confirming the pattern image.

Further, the control unit 21b controls irradiation of laser light by the laser light source 31 so that the laser marking is performed until the laser light penetrates the metal layer ME. Therefore, for example, even when the metal layer ME is cut out and the fault point is analyzed after the post-process, that is, the laser marking in the fault analysis, it is possible to reliably confirm the marking position.

Further, the analysis unit 21c generates the pattern image while the laser marking is being performed by the laser light. Accordingly, it is possible to perform the laser marking until the marking position can be recognized using the pattern image.

Further, it is possible to use a scheme for detecting the luminescence from the semiconductor device D, such as luminescence measurement, by including the light source 12 that outputs the illumination light and by the two-dimensional camera 15 imaging the illumination light reflected in the semiconductor device D. It is possible to reliably confirm the mark image by using this scheme.

Further, the light source 12 is included, and the observation optical system 13 irradiates the semiconductor device D with the light output from the light source 12 from the substrate SiE side, and transmits the light reflected from the semiconductor device D according to the radiated light to the two-dimensional camera 15. Accordingly, it is possible to use a scheme of irradiating the semiconductor device D with light and generating a pattern image. By using this scheme, it is possible to reliably confirm the mark image.

Modification Example of First Embodiment

Next, an inspection system 1C according to a modification example of the first embodiment will be described with reference to FIG. 7. In description of this embodiment, differences from the first embodiment described above will be mainly described.

Figure 7:
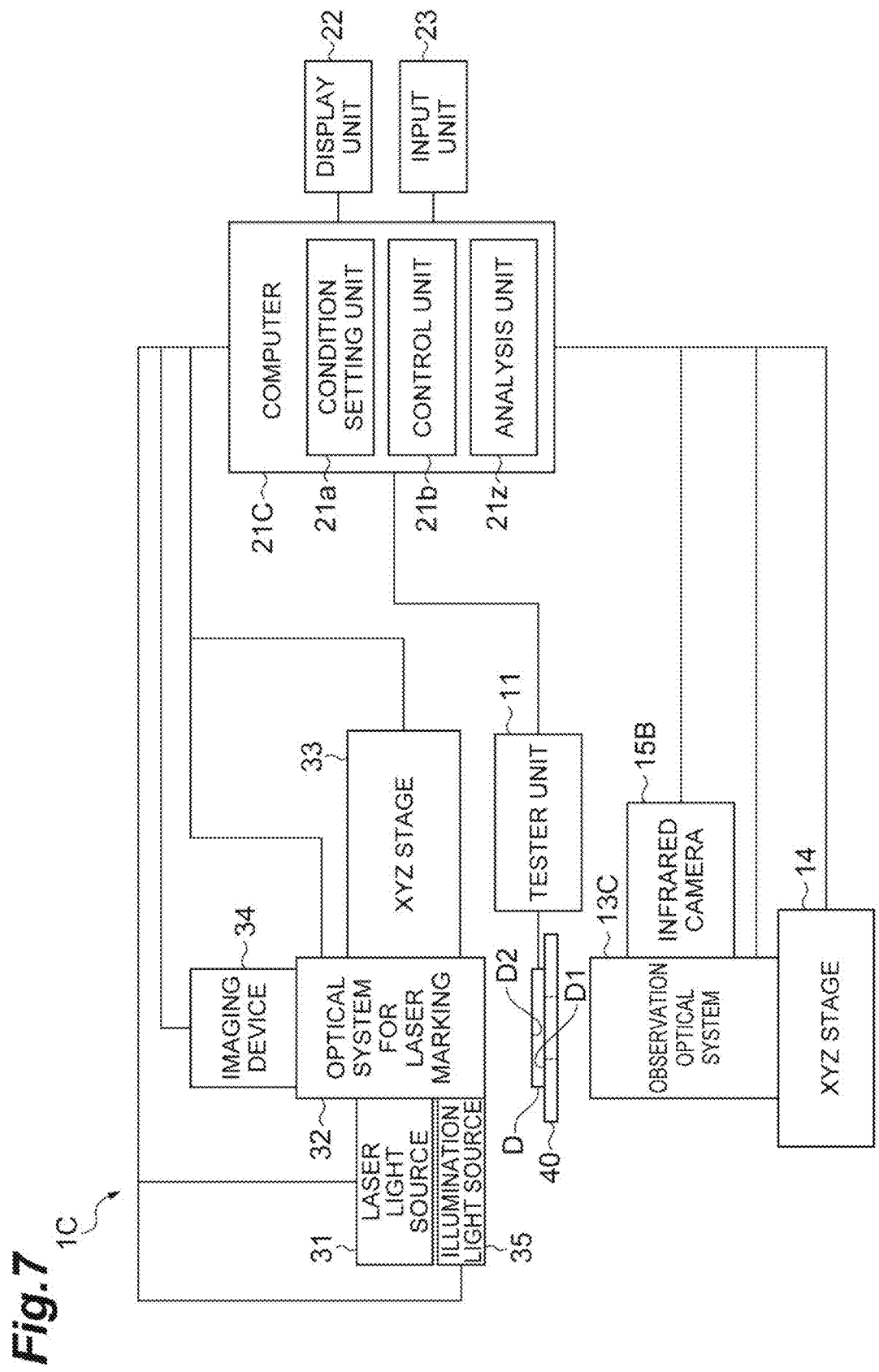
FIG. 7 is a configuration diagram of an inspection system according to a modification example of the first embodiment.

As illustrated in FIG. 7, the inspection system 1C according to the modification example of the first embodiment does not include the light source 12 (second light source) and includes an infrared camera 15B (photodetector) in place of the two-dimensional camera 15, unlike the inspection system 1. Further, since the light source 12 is not included, an observation optical system 13C may not include a beam splitter. The infrared camera 15B images heat rays from the semiconductor device D, and generates a measurement image. It is possible to identify a heating point in the semiconductor device D using an infrared image according to the measurement image. By identifying the heating point, it is possible to identify the fault point of the semiconductor device D. When the heat rays are measured, an InSb camera or the like may be used as the infrared camera 15B. Further, the heat rays are radiation with a wavelength of 2 μm to 10 μm. Further, by imaging the heat rays from the semiconductor device D, it is possible to acquire an image showing a distribution of emissivity of the semiconductor device D.

An analysis unit 21z of the computer 21C generates an infrared image based on the above-described measured image. Further, the analysis unit 21z generates a pattern image based on the detection signal. The analysis unit 21z generates a superimposed image obtained by superimposing the infrared image on the pattern image, as an analysis image. The process of identifying the fault point from the analysis image is the same as in the first embodiment.

A procedure in which the infrared camera 15B measures the heat rays from the semiconductor device D and the analysis unit 21z generates the infrared image will be described in detail. First, in a state in which the stimulation signal such as the test pattern is applied by the tester unit 11, a first measurement image including generated heat of the semiconductor device D is acquired by the infrared camera 15B. The first measurement image is generated by sending a plurality of pieces of image data continuously captured in a predetermined exposure time to the computer 21C and adding the plurality of pieces of image data in the analysis unit 21z. The first measurement image includes information on the generated heat of the semiconductor device D and a shape of an element forming the semiconductor device D. Then, in a state in which the application of the stimulus signal by the tester unit 11 is stopped, a second measurement image including only the information on the shape of the element forming the semiconductor device D is acquired by the infrared camera 15B. The second measurement image is generated by sending a plurality of pieces of image data continuously captured in a predetermined exposure time to the computer 21C and adding the plurality of pieces of image data in the analysis unit 21z, similar to the first measurement image. The second measurement image includes only the information on the shape of the element forming the semiconductor device D. The analysis unit 21z performs a process of subtracting the second measurement image from the first measurement image to generate an infrared image including only the generated heat of the semiconductor device D. The analysis unit 21z generates a superimposed image obtained by superimposing the infrared image on the second measurement image or the first measurement image, as an analysis image, and generates the second measurement image as a pattern image. The process of identifying the fault point from the analysis image is the same as in the first embodiment.

During the marking process, the observation optical system 13 transmits heat rays from the semiconductor device D to the infrared camera 15B. The infrared camera 15B detects the heat rays and outputs image data (detection signal) to the computer 21C. The analysis unit 21z generates the pattern image based on the image data, as described above. The process after the pattern image is generated is the same as in the first embodiment.

Second Embodiment

Next, an inspection system 1A according to a second embodiment will be described with reference to FIG. 5. In description of this embodiment, differences from the first embodiment described above will be mainly described.

Figure 5:
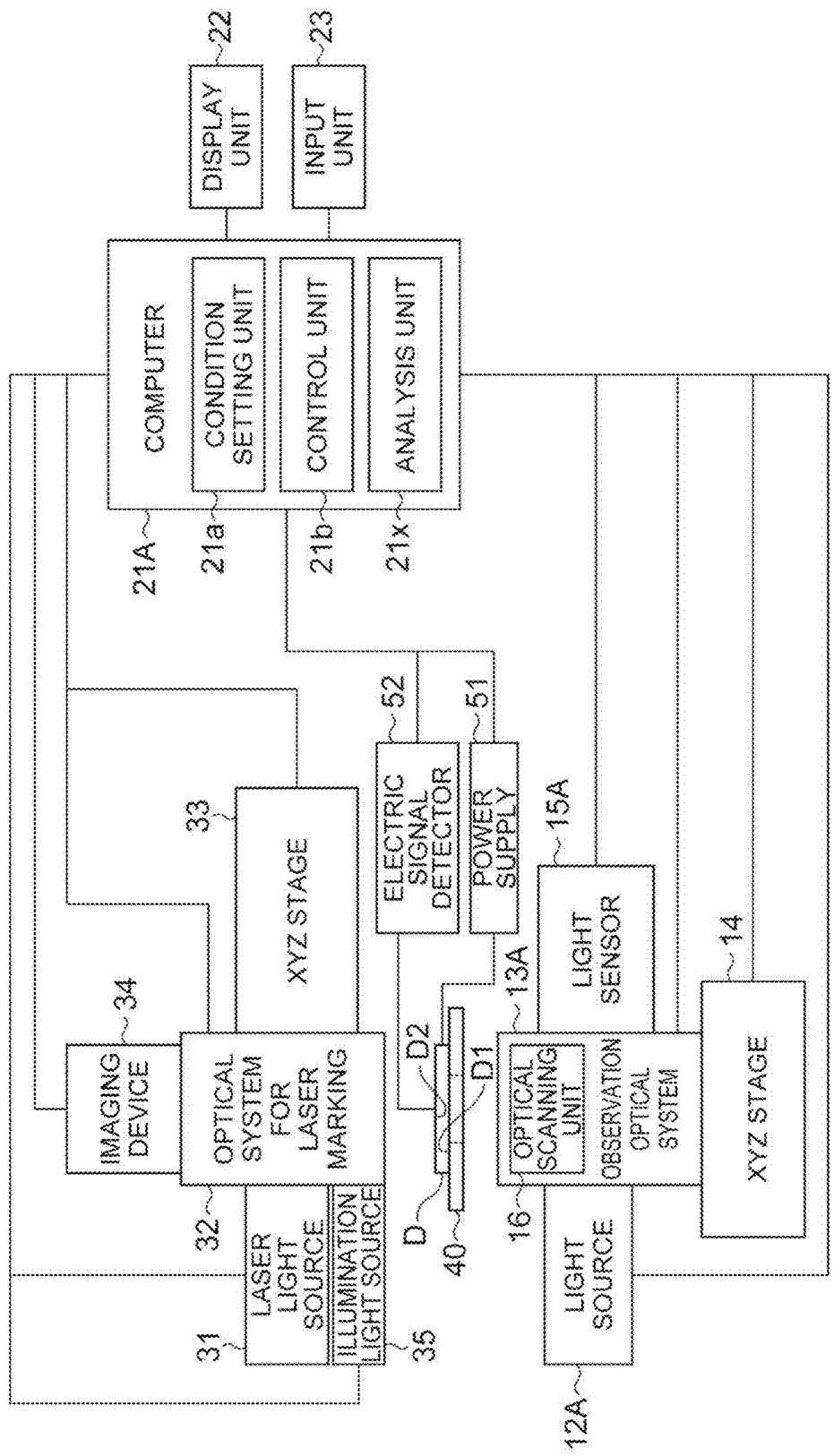
FIG. 5 is a configuration diagram of an inspection system according to a second embodiment of the present invention.

As illustrated in FIG. 5, in the inspection system 1A according to the second embodiment, a voltage is applied from the power supply 51 to the semiconductor device D. Light is output from the light source 12A and applied to the substrate SiE, that is, the back surface D1 of the semiconductor device D through the observation optical system 13A.

The light output from the light source 12A may be coherent light such as laser light. As the light source 12A that outputs the coherent light, a solid-state laser light source, a semiconductor laser light source, or the like can be used. The light source 12A in a case in which an optical beam induced resistance change (OBIRCH) image or a soft defect localization (SDL) image is acquired outputs laser light having a wavelength band in which the semiconductor device D does not generate charges (carriers). For example, the light source 12A in a case in which the semiconductor device 2 is formed of a silicon material outputs laser light having a wavelength band longer than 1200 nm, such as about 1300 nm. Further, the light source 12A in a case in which an OBIC image or a laser assisted device alteration (LADA) image is acquired needs to output light in a wavelength range in which the semiconductor device 2 generates charges (carriers), and outputs light of 1200 nm or less, such as laser light in a wavelength band of about 1064 nm. The light output from the light source 12A may be incoherent (non-coherent) light. As the light source 12A that outputs incoherent light, a super luminescent diode (SLD), amplified spontaneous emission (ASE), a light emitting diode (LED), and the like can be used. The light output from the light source 12A is guided to the observation optical system 13A through a polarization preserving single-mode optical coupler (not illustrated) and a polarization preserving single-mode optical fiber for probe light, and the semiconductor device D is irradiated with the light. The observation optical system 13A includes an optical scanning unit 16 and an objective lens. The optical scanning unit 16 scans an illuminated spot on the back surface D1 of the semiconductor device D. The optical scanning unit 16 includes, for example, an optical scanning element such as a galvano mirror or an MEMS mirror. The objective lens concentrates the light guided by the optical scanning unit 16 onto an irradiation spot.

In an electric signal detector 52 electrically connected to the semiconductor device D, an electric signal generated in the semiconductor device D according to the laser light is detected. The electric signal detector 52 outputs an electrical signal characteristic value according to the detected electrical signal to the computer 21A. Further, the light sensor 15A (photodetector) detects reflected light of the semiconductor device D according to the laser light and outputs a detection signal to the computer 21A. The light sensor 15A is, for example, a photodiode, an avalanche photodiode, a photomultiplier tube, or an area image sensor.

The analysis unit 21x of the computer 21A generates an electrical signal image obtained by associating the electrical signal characteristic value with a scanning position of the laser light according to the optical scanning unit 16 controlled by the control unit 21b and performing conversion into an image. Further, the analysis unit 21x generates an optical reflection image based on the detection signal. The analysis unit 21x generates, as the analysis image, a superimposed image obtained by superimposing the electric signal image on the optical reflection image. The process of identifying the fault point from the analysis image is the same as in the first embodiment.

The electrical signal image is, for example, an OBIC image that is a photovoltaic current image, an OBIRCH image that is an electrical amount change image, an SDL image that is an Errata image, and a LADA image. The OBIC image is an image obtained by detecting the photovoltaic current generated by the laser irradiation and performing conversion into an image using a current value or a change in current value of the photovoltaic current as an electric signal characteristic value. The OBIRCH image is an image obtained by irradiating the semiconductor device D with a laser in a state in which a constant current is applied to the semiconductor device D, to change a resistance value at an irradiation position in the semiconductor device D, and performing conversion into an image using a change value of a voltage value or a voltage according to a change in the resistance value as an electrical signal characteristic value. The OBIRCH image is an image obtained by irradiating the semiconductor device D with a laser in a state in which a constant voltage is applied to the semiconductor device D, to change a resistance value at an irradiation position in the semiconductor device D, and performing conversion into an image using a change value of a current according to a change in the resistance value as an electrical signal characteristic value. The SDL image is an image obtained by irradiating the semiconductor device D with a laser with a wavelength not exciting carriers in a state in which a stimulus signal such as a test pattern is applied to the semiconductor device D, detecting a malfunction state, performing conversion into a luminance count using information (for example, PASS/FAIL signal) related to the malfunction state as an electric signal characteristic value, and performing information image conversion. The LADA image is an image obtained by irradiating the semiconductor device D with a laser with a wavelength exciting carriers in a state in which a stimulus signal such as a test pattern is applied to the semiconductor device D, detecting a malfunction state, performing conversion into a luminance count using information (for example, PASS/FAIL signal) related to the malfunction state as an electric signal characteristic value, and performing information image conversion.

During the marking process, the light source 12A outputs the light with which the back surface D1 side of the semiconductor device D is irradiated. The observation optical system 13 irradiates the back surface D1 of the semiconductor device D with the light output from the light source 12A. The observation optical system 13 transmits the reflected light from the semiconductor device D according to the radiated light to the light sensor 15A. The light sensor 15A detects the reflected light and outputs the detection signal to the computer 21A. The analysis unit 21x generates a pattern image that is an optical reflection image based on the detection signal. A process after the pattern image is generated is the same as in the first embodiment.

Third Embodiment

Figure 6:
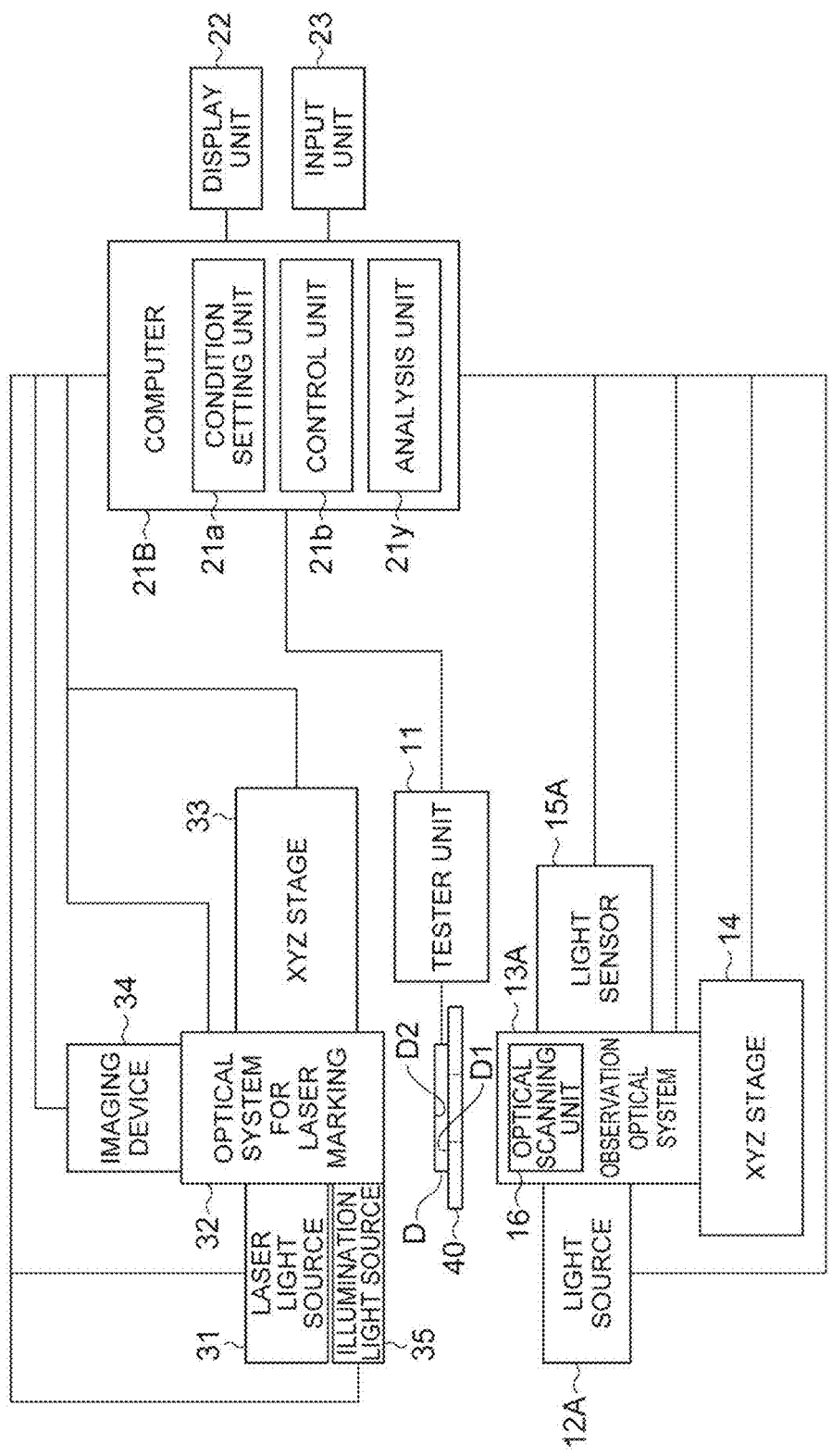
FIG. 6 is a configuration diagram of an inspection system according to a third embodiment of the present invention.

Next, an inspection system 1B according to a third embodiment will be described with reference to FIG. 6. In description of this embodiment, differences from the first embodiment and the second embodiment described above will be mainly described.

The inspection system 1B according to the third embodiment identifies a fault position using a light probing technology called EOP or Electro-Optical Frequency Mapping (EOFM).

In the inspection system 1B according to the third embodiment, a semiconductor device D is scanned by light from a light source 12A, and reflected light from the semiconductor device D is detected in a light sensor 15A. The reflected light is output to a computer 21B, and an optical reflection image is generated by an analysis unit 21y. Then, in a state in which a stimulation signal such as a test pattern is repeatedly applied from a tester unit 11 to the semiconductor device D, an irradiation spot selected by a user based on the optical reflection image displayed on a display unit 22 and input by the input unit 23 is irradiated with the light output from the light source 12A. A wavelength of the light output from the light source 12A, for example, is equal to or longer than 530 nm, for example, 1064 nm or more. The reflected light modulated according to an operation of an element in the semiconductor device D is detected in the light sensor 15A, and is output as a detection signal to the computer 21B. In the analysis unit 21y, a signal waveform is generated based on the detection signal, and the signal waveform is displayed on the display unit 22. By looking for a fault point from the signal waveform observed while changing the irradiation spot based on the above-described optical reflection image, the above-described optical reflection image may be used as analysis image.

Further, the analysis unit 21y may generate an electro-optical frequency mapping image (EOFM image) obtained by associating phase difference information between the detection signal and the stimulation signal such as the test pattern with an irradiation position and performing conversion into an image. In this case, the phase difference information can be obtained from an AC component extracted from the detection signal. Further, it is possible to obtain the optical reflection image by associating a DC component extracted simultaneously with the AC component with the irradiation position and performing conversion into an image. A superimposed image obtained by superimposing the EOFM image on the optical reflection image can be used as an analysis image.

Modification Example of Third Embodiment

Figure 8:
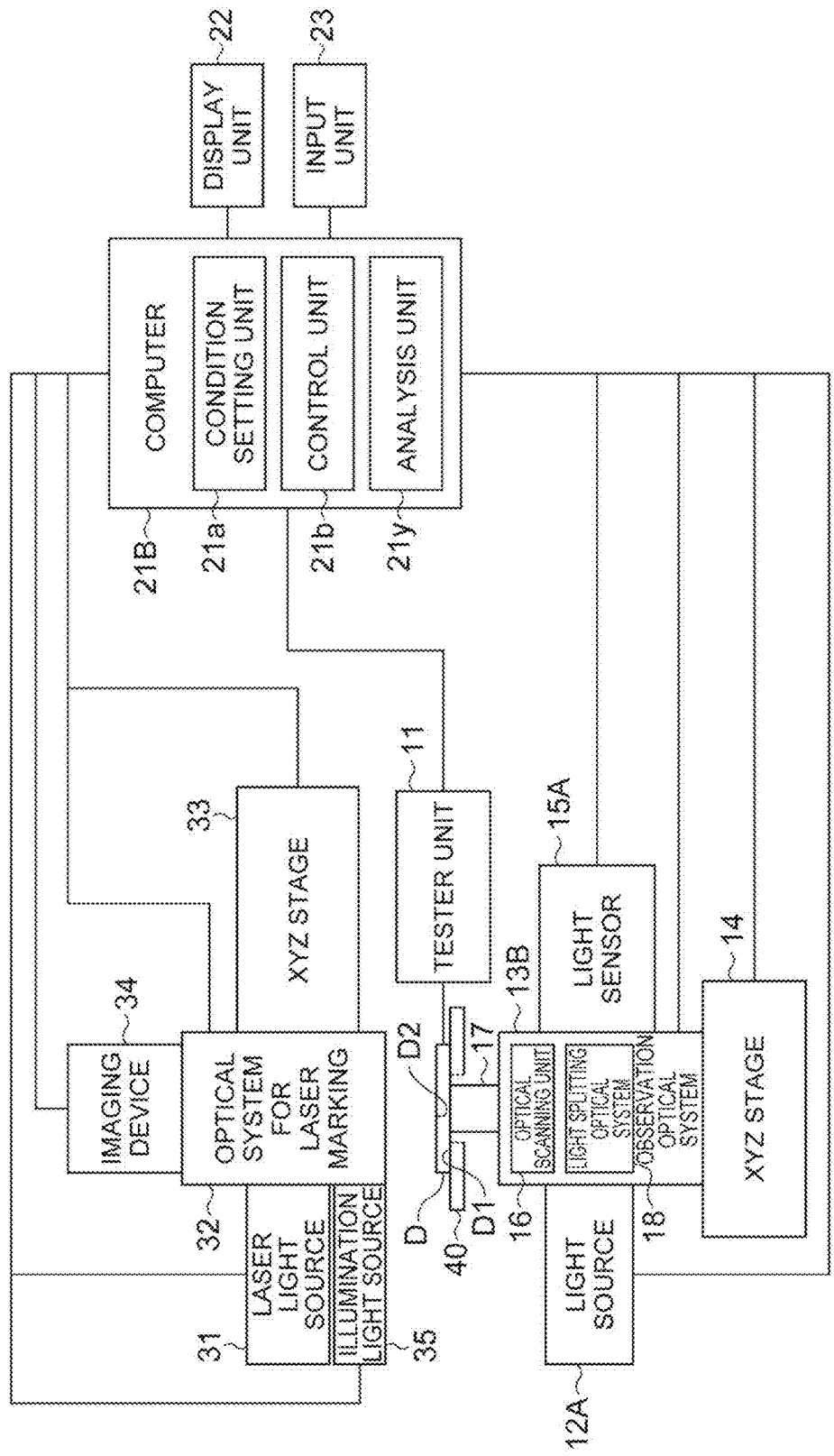
FIG. 8 is a configuration diagram of an inspection system according to a modification example of the third embodiment.

Next, an inspection system 1D according to a modification example of the third embodiment will be described with reference to FIG. 8. In description of this embodiment, differences from the third embodiment described above will be mainly described.

The inspection system 1D according to a modification example of the third embodiment identifies a fault position using an optical magnetic probing technology. As illustrated in FIG. 8, the inspection system 1D according to the modification example of the third embodiment is different from the inspection system 1B in that a magneto-optical crystal (MO crystal) 17 is included and an observation optical system 13B includes a light splitting optical system. The magneto-optical crystal 17 is configured so that the magneto-optical crystal 17 can be arbitrarily arranged with respect to the semiconductor device D. First, in the inspection system 1D, switching to a configuration in which the magneto-optical crystal 17 is not arranged between the objective lens and the semiconductor device D occurs. Thus, it is possible to generate an optical reflection image, as in the second embodiment or the third embodiment. Then, switching to a configuration in which the magneto-optical crystal 17 is arranged between the objective lens and the semiconductor device D occurs, and the magneto-optical crystal 17 is caused to abut on the semiconductor device D to which the stimulation signal such as a test pattern is applied. The magneto-optical crystal 17 is irradiated with the light from the light source 12A through the light splitting optical system 18 and the optical scanning unit 16, and the reflected light is detected by the light sensor 15A. In the semiconductor device D, if a current flows due to the application of the stimulus signal such as the test pattern, a surrounding magnetic field is changed and a polarization state of the light reflected by the magneto-optical crystal 17 is changed. The light of which an intensity changes according to the change in the polarization state is input to the light sensor 15A through the light splitting optical system 18. Thus, the light of which an intensity changes according to the change in the polarization state is detected by the light sensor 15A, and output as a detection signal to the computer 21B. Accordingly, a magnetic-optical image is generated. A superimposed image obtained by superimposing the magnetic-optical image on the optical reflection image may be used as an analysis image.

The embodiments of the present invention have been described, but the present invention is not limited to the above embodiments.

For example, the case in which laser marking is performed until the laser light penetrates the metal layer ME and the surface in contact with the metal layer ME in the substrate SiE is exposed has been described, but the present invention is not limited thereto, and a depth of a hole due to laser marking is such a depth that the mark image appears in the pattern image. Specifically, for example, laser marking may also be performed even after the laser light penetrates the metal layer ME and the surface in contact with the metal layer ME in the substrate SiE is exposed. For example, when a thickness of the metal layer ME is 10 µm and a thickness of the substrate SiE is 500 µm, the hole may be formed with an additional depth of about 1 µm from the surface in contact with the metal layer ME in the substrate SiE by laser marking. Further, the laser marking may not necessarily be performed to penetrate the metal layer ME. For example, when the thickness of the metal layer ME is 10 µm and the thickness of the substrate SiE is 500 µm, the thickness of the metal layer ME at a point at which the hole is formed by laser marking may be about 50 nm, and the hole may not reach the surface in contact with the metal layer ME in the substrate SiE.

Further, the case in which the generation of the pattern image is performed while the laser marking is being performed has been described, but the present invention is not limited thereto. That is, for example, when the output of the laser light is stopped, the pattern image may be generated. In this case, the output of the laser light, and the stopping of the laser light, that is, the generation of the pattern image may be performed alternately at predetermined intervals.

Further, when a wavelength of the laser light output from the laser light source 31 is equal to or longer than 1000 nm, the observation optical system 13 (13A and 13B) may include an optical filter that blocks only the laser light having this wavelength. Therefore, even when the laser light output from the laser light source 31 is transmitted through the substrate SiE of the semiconductor device D, the laser light is blocked in the observation optical system 13, and accordingly, it is possible to prevent a photodetector such as the two-dimensional camera 15 from being damaged by the laser light.

Further, the wavelength of the laser light output from the laser light source 31 may be shorter than 1000 nanometers. In this case, for example, when the semiconductor device D includes a substrate such as a silicon substrate, the laser light is absorbed into the substrate. Accordingly, it is possible to prevent the photodetector such as the two-dimensional camera 15 from being damaged by the laser light without including the optical filter or the like.

Further, the present invention is not limited to applying the stimulus signal to the semiconductor device D using the tester unit 11, and the stimulation signal may be applied to the semiconductor device D using a device that applies a voltage or a current to the semiconductor device D as a stimulus signal applying unit.

REFERENCE SIGNS LIST 1, 1A, 1B, 1C, 1D Inspection system
12, 12A Light source (second light source)
13, 13A, 13B Observation optical system
15 Two-dimensional camera (photodetector)
15A Light sensor (photodetector)
15B Infrared camera (photodetector)
21$b$ Control unit (marking control unit)
21$c$, 21$x$, 21$y$, 21$z$ Analysis unit (image processing unit)
31 Laser light source (first light source)
32 Optical system for laser marking
D Semiconductor device
ME Metal layer
SiE Substrate

The invention claimed is:

1. An inspection system for performing laser marking on a semiconductor device having a metal layer formed on a substrate, the inspection system comprising:
a first light source configured to output laser light;
an optical system for laser marking configured to irradiate the semiconductor device with the laser light from the metal layer side;
a marking controller configured to control the first light source to control the laser marking;
an observation optical system configured to be arranged on the substrate side of the semiconductor device and to transmit light from the semiconductor device;
a photodetector configured to detect the light from the semiconductor device through the observation optical system and to output a detection signal; and
an image processor configured to generate a pattern image based on the detection signal,
wherein the marking controller is configured to control the irradiation of the laser light so that the laser marking is performed until a mark image formed by the laser marking appears in the pattern image.

2. The inspection system according to claim 1,
wherein the marking controller is configured to control the irradiation of the laser light so that the laser marking is performed until the laser light penetrates through the metal layer.

3. The inspection system according to claim 1,
wherein the image processor is configured to generate the pattern image while the laser marking is being performed by the laser light.

4. The inspection system according to claim 1, further comprising:
a second light source configured to output illumination light,
wherein the photodetector is a two-dimensional camera configured to image the illumination light reflected in the semiconductor device.

5. The inspection system according to claim 1,
wherein the photodetector is an infrared camera configured to image heat rays from the semiconductor device.

6. The inspection system according to claim 1, further comprising:
a second light source configured to output light,
wherein the observation optical system comprises an optical scanner configured to scan the semiconductor device with the light output from the second light source and to transmit light reflected from the semiconductor device to the photodetector.

7. The inspection system according to claim 1,
wherein the first light source is configured to output the laser light having a wavelength equal to or longer than 1000 nm, and
the observation optical system comprises an optical filter configured to block light including the wavelength of the laser light.

8. The inspection system according to claim 1,
wherein the first light source is configured to output the laser light having a wavelength shorter than 1000 nanometers.

9. An inspection method of performing laser marking on a semiconductor device in which a metal layer is formed on a substrate, the inspection method comprising:
performing laser marking by irradiating the semiconductor device with laser light from the metal layer side;

transmitting light from the semiconductor device to a photodetector by using an observation optical system arranged on the substrate side of the semiconductor device; and generating a pattern image based on the light from the semiconductor device, wherein performing the laser marking comprises performing the irradiation of the laser light until a mark image formed by the laser marking appears in the pattern image.

10. The inspection method according to claim 9, wherein performing the laser marking comprises performing the laser marking until the laser light penetrates the metal layer.

11. The inspection method according to claim 9, wherein generating the pattern image comprises generating the pattern image while the laser marking is being performed.

12. The inspection method according to claim 9, wherein the laser light has a wavelength equal to or longer than 1000 nm, and the observation optical system comprises an optical filter blocking light having the wavelength of the laser light.

13. The inspection method according to claim 9, wherein the laser light has a wavelength shorter than 1000 nanometers.

* * * * *